United States Patent
Elgcrona et al.

(10) Patent No.: US 11,482,832 B2
(45) Date of Patent: Oct. 25, 2022

(54) MULTI-WAVELENGTH LASER SYSTEM

(71) Applicant: Cobolt AB, Solna (SE)

(72) Inventors: Gunnar Elgcrona, Solna (SE); Magnus Rådmark, Solna (SE); Håkan Karlsson, Stockholm (SE)

(73) Assignee: COBOLT AB, Solna (SE)

( * ) Notice: Subject to any disclaimer, the term of this patent is extended or adjusted under 35 U.S.C. 154(b) by 0 days.

(21) Appl. No.: 16/314,782

(22) PCT Filed: Jun. 30, 2017

(86) PCT No.: PCT/EP2017/066318
§ 371 (c)(1),
(2) Date: Jan. 2, 2019

(87) PCT Pub. No.: WO2018/007260
PCT Pub. Date: Jan. 11, 2018

(65) Prior Publication Data
US 2019/0252850 A1    Aug. 15, 2019

(30) Foreign Application Priority Data

Jul. 5, 2016 (EP) .................................... 16177959

(51) Int. Cl.
*H01S 5/40* (2006.01)
*H01S 5/00* (2006.01)
(Continued)

(52) U.S. Cl.
CPC ........ *H01S 5/0071* (2013.01); *G02B 27/1006* (2013.01); *H01S 5/02326* (2021.01);
(Continued)

(58) Field of Classification Search
CPC .. H01S 5/4012; H01S 5/4075; H01S 5/02248; H01S 5/02252; H01S 5/4087;
(Continued)

(56) References Cited

U.S. PATENT DOCUMENTS 4,846,550 A * 7/1989 Schuma ................. B23K 26/06
                                                     359/669
6,771,686 B1   8/2004 Ullman et al.
(Continued)

FOREIGN PATENT DOCUMENTS

EP    2 171 523 B1    4/2010

OTHER PUBLICATIONS

International Search Report (PCT/ISA/210) dated Sep. 18, 2017, by the European Patent Office as the International Searching Authority for International Application No. PCT/EP2017/066318.
(Continued)

*Primary Examiner* — Tod T Van Roy
(74) *Attorney, Agent, or Firm* — Buchanan Ingersoll & Rooney P.C.

(57) ABSTRACT

A multi-wavelength laser module including a base plate, a plurality of radiation sources mounted on the base plate, at least one telescope including a first lens and a second lens wherein the second lens is arranged at a distance from the first lens along a radiation beam path, thereby creating a telescopic effect. A beam angle correction plate is arranged between the first lens and the second lens in the radiation beam path, the beam angle correction plate being angled in relation to the radiation beam path so as to parallel shift the radiation beam inside the telescope and thereby adjust the pointing direction of the radiation beam after passage of the telescope. Further, a method for assembling a multi-wavelength laser system provided with telescopes with such beam angle correction plate.

16 Claims, 3 Drawing Sheets

(51) Int. Cl.
  *G02B 27/10* (2006.01)
  *H01S 5/02326* (2021.01)
  *H01S 3/23* (2006.01)
  *G02B 19/00* (2006.01)
  *G02B 23/00* (2006.01)

(52) U.S. Cl.
  CPC .......... *H01S 5/4012* (2013.01); *H01S 5/4075* (2013.01); *H01S 5/4087* (2013.01); *G02B 19/0057* (2013.01); *G02B 23/00* (2013.01); *G02B 27/1073* (2013.01); *H01S 3/2375* (2013.01); *H01S 5/005* (2013.01)

(58) Field of Classification Search
  CPC .............. H01S 5/4093; G02B 19/0052; G02B 19/0057; G02B 19/0061; G02B 23/00–24
  See application file for complete search history.

(56) References Cited

U.S. PATENT DOCUMENTS

| | | | |
|---|---|---|---|
| 9,014,224 | B2 | 4/2015 | O'Shaughnessy et al. |
| 9,209,605 | B1* | 12/2015 | Guo .................... H01S 5/4062 |
| 2002/0025096 | A1 | 2/2002 | Wang et al. |
| 2009/0190218 | A1* | 7/2009 | Govorkov .......... B23K 26/0613 |
| | | | 359/489.08 |
| 2011/0058163 | A1 | 3/2011 | Rich |
| 2011/0103056 | A1* | 5/2011 | Wolak ................ G02B 27/0905 |
| | | | 362/235 |
| 2011/0176219 | A1 | 7/2011 | Bergann et al. |
| 2011/0244608 | A1 | 10/2011 | Hellstroem et al. |
| 2013/0140429 | A1 | 6/2013 | Schneider |
| 2015/0331207 | A1 | 11/2015 | Pezeshki et al. |
| 2015/0331245 | A1* | 11/2015 | Tayebati .................. G02B 5/18 |
| | | | 359/634 |
| 2015/0378184 | A1* | 12/2015 | Tayebati ................. G02F 1/295 |
| | | | 250/492.1 |
| 2016/0077416 | A1* | 3/2016 | Liu ...................... G03B 21/208 |
| | | | 362/19 |
| 2016/0149374 | A1 | 5/2016 | Chann et al. |
| 2018/0154481 | A1* | 6/2018 | Valentin ............. B23K 26/0648 |
| 2018/0335582 | A1* | 11/2018 | Ishige ...................... G02B 6/42 |
| 2018/0348451 | A1* | 12/2018 | Yamamoto ................ H01S 5/18 |

OTHER PUBLICATIONS

Written Opinion (PCT/ISA/237) dated Sep. 18, 2017, by the European Patent Office as the International Searching Authority for International Application No. PCT/EP2017/066318.

Extended European Search Report dated Feb. 23, 2017, issued by the European Patent Office in corresponding European Application No. 16177959.0-1556, (10 pages).

* cited by examiner

| Provide base plate for components | S1 |

| Mount plurality of radiation sources with telescopic lens arrangements | S2 |

| Mount beam angle correction plate inside telescopes | S3 |

Fig. 3

MULTI-WAVELENGTH LASER SYSTEM

TECHNICAL FIELD

The present invention relates a multi-wavelength laser system, and to a method of assembling a multi-wavelength laser system.

BACKGROUND ART

Multi-wavelength laser systems for which the output is a combination of individual laser beams from different lasers are known in the art. In such systems, there is a general challenge in terms of aligning the individual beams into a combined output or into a desired output beam pattern, where both position of the beams within the multi-wavelength laser system and the pointing direction of the output beams must be handled. In particular, if the pointing direction of the individual laser beams differ, then the combined multi-wavelength output of the system will separate into individual beams after some distance, or the desired pattern will change depending on the distance from the source.

Existing multi-wavelength laser systems, sometimes referred to as laser light engines, are assembled from separate and self-contained laser modules and the output beams from the separate laser modules are combined and aligned externally from the laser modules. This prior art approach has the advantage that individual laser modules within the laser light engine can be conveniently exchanged or swapped. However, it is also associated with a major drawback, in that the alignment and combination of the output beams from the separate laser modules becomes very challenging. It has typically been necessary to include means for post-alignment of the beams in order to repeatedly correct for misalignment during use of the devices. Another drawback is that these prior art systems are bulky and expensive, largely due to their inherent design as explained above.

The problem of aligning/combining the individual beams has traditionally been addressed by using adjustment mirrors for adjusting the output angle from each laser in the system. Such a solution is e.g. shown in the patent document EP 2 171 523. A problem with using mirrors is, however, that the mirrors have a tendency of needing further service adjustment after some time and/or that non-optimal alignment occurs due to movement of components during manufacture or use. In this context, it is a further complication that adjustment mirrors are located in the beam path of the combined laser beam of the laser system, thus requiring an iterative alignment operation when adjusting one mirror since an adjustment of one mirror in the beam path will influence beams added to the combined beam at an earlier stage.

U.S. Pat. No. 9,014,224 presents a solution using beam adjusters comprising prismatic solutions, e.g. Risley prism pairs, placed in the laser beams after each laser, combined with a beam positioning system for adjustment of the lateral position of the beams for overlapping them. Each prism pair, however, still needs adjustment, which will inflict subsequent adjustment needs in the positioning system.

US 2013/0140429 shows a system similar to the above with an active feedback and automatic adjustment of beams by rotation adjustment of Risley prisms pairs for constant beam alignment.

Other, more general, background art can be found in e.g. U.S. Pat. No. 6,771,686, which discloses that correction optics of a row of emitter elements is divided into several segments in order to prevent degradation of beam quality at the focus caused by nonconformities between diode bars, or between the row of emitter elements, and the correction optics. Other optical coupling systems are disclosed in US 2016/0149374 and in US 2002/0025096.

There is thus a need for a simpler and less sensitive solution for fixing the alignment of the position and direction of laser beams in systems having more than one laser or radiation source.

SUMMARY OF THE INVENTION

The present invention therefore provides a multi-wavelength laser module, and a method for assembling the same, having permanently aligned beam positions and directions in a compact package essentially free from any service needs or need for post-manufacturing corrections. The inventors have realized that the lack of integration between the constituent laser modules in the prior art can be a major drawback. As mentioned above, an approach is commonly used wherein completely separate laser modules are combined using external optics into a multi-wavelength beam. In other words, the prior art has relied on a beam combining system that is external to the actual light modules. This prior art approach is thus associated with various drawbacks in terms of maintaining the positioning of the individual beams from the constituent light modules, and this has necessitated complex and expensive adjustment systems involving moving parts.

A typical requirement on the beam quality and overlap can be that it should be possible to couple the combined beam into a single-mode optical fiber with at least 50% efficiency.

It is an object of the present invention to mitigate, alleviate or eliminate one or more of the above-identified deficiencies in the art, singly or in any combination, and solve at least the above mentioned problem.

The present invention is generally based on the understanding that an improved multi-wavelength laser module can be obtained through higher integration of the constituent laser sources as well as of the beam combining optics.

By having the laser sources mounted on a common base plate, rather than in individual packages, a big step towards higher integration and better beam quality is taken. Further, according to the present invention, the positions and pointing directions of beams from the constituent laser sources are determined during manufacture. An inventive approach towards providing excellent beam pointing directions of the individual beams, allowing for a combination into a stable multi-wavelength output of high quality, is to integrate beam correction plates into the telescopes for the constituent light sources.

When building a multi-wavelength laser module according to the present invention, the position and orientation of such beam correction plates are preferably determined in a manufacturing step subsequent to mounting the other optical components. Thereby, any minor discrepancy that may have been introduced by previous manufacturing steps, e.g. heat curing steps, can be corrected such that an excellent output is obtained.

By mounting a plurality of radiation sources on a common base plate, and by having the optics for beam alignment and beam combination integrated on the same base plate, a very high level of integration is achieved. Since the present invention avoids using individual packages for the constituent radiation sources, it is even conceivable to have the optical paths of the radiation sources overlap on the base plate. This high level of integration also allows of a design in which the constituent radiation sources share some components, such as electronics, thus further contributing to the degree of integration and compactness.

According to a first aspect, these and other objects are achieved, at least in part, by providing a multi-wavelength laser system comprising a base plate, a plurality of radiation sources mounted on the base plate, and at least one telescope for at least one laser beam in the multi-wavelength laser system. The telescope comprises a first lens and a second lens. The second lens is arranged at a distance from and generally aligned with the first lens in a radiation beam path, thereby creating a telescopic effect. In the telescope a beam angle correction plate is arranged between the first lens and the second lens in the radiation beam path. The beam angle correction plate is typically angled in relation to the radiation beam path so as to introduce a parallel shift of the radiation beam between the first and second lens of the telescope, resulting in a shift in pointing direction for a beam after passage of the telescope.

It has been noted that, in embodiments of the invention, the position of the individual beams can usually be fixed within an accepted tolerance. However, there will often be a pointing error unless special care is taken. By mounting a beam angle correction plate arranged inside the telescope and in the radiation beam path, the pointing error between individual beams can be corrected. According to the present invention, the pointing direction of at least one of the individual beams is corrected in this manner, but more preferably if there are N light sources, N−1 of them are preferably mutually corrected in this way to correspond with the last (N:th) source which is taken as a reference.

By mounting the individual laser sources on a common base plate and in a common housing, the overall footprint of the multi-wavelength laser system can be very small. In an exemplary embodiment of the present invention, four radiation sources are mounted on a common base plate having a footprint of 5×7 cm². Preferably, care is also taken to handle thermal expansion of the base plate and the various components mounted thereon. Together with the teachings of the present invention, this can result in properly aligned beams that require no further adjustment after manufacture, which allows of a high-precision multi-wavelength laser system that is both hermetically sealed and free of moving parts, and thus of low maintenance and potentially even service-free.

In embodiments of the invention, the beam angle correction plate is typically a plane-parallel plate.

In one preferred embodiment of the invention, the beam angle correction plate may be a glass plate. It may have anti-reflection coated surfaces for the relevant wavelength in order to minimize losses.

The base plate of the multi-wavelength system preferably has a footprint smaller than about 25×25 cm², and preferably smaller than about 15×15 cm². When the multi-wavelength system is mounted on such a small base plate, the overlapping or positioning of the individual laser beams may not be a big problem since the laser beams have fairly short beam paths inside the casing of the multi-wavelength system. However, the angles of the individual beams may differ slightly, which according to the present invention is addressed by mounting a beam angle correction plate inside the telescope.

The beam angle correction plate is typically placed in a slanting orientation relative to the beam in the beam path between the first and second lenses of the telescope. In some cases, however, the need for beam angle correction may be very small or even non-existing, and in such case the plate would typically be mounted substantially normal to the beam (i.e. thereby substantially not altering the pointing direction of the beam passing through the telescope).

Preferably, telescopes are provided for N−1 of the individual N radiation sources, wherein the telescopes are used for aligning the corresponding radiation source with the one radiation source for which no telescope is provided. Depending on the circumstances, however, it may be sufficient to provide a telescope for fewer than N−1 of the radiation sources, and in some implementations it may even suffice to have one of the radiation sources provided with a telescope. It is of course also conceivable that all the radiation sources are provided with a respective telescope and beam correction plate, e.g. when alignment of all beams to some other reference is desired.

Each radiation source is preferably selected from the group of radiation sources comprising: a light-emitting diode (LED), a diode laser (DL), a diode-pumped solid state laser (DPSSL), an optically pumped semiconductor laser (OPSL) and a solid state laser (SSL). However, it is envisaged that any sufficiently small light source can be used in embodiments of this invention.

According to a second aspect of the invention, the objects are achieved in full, or at least in part, by a method for assembling a multi-wavelength laser system. The method comprises the steps of providing a base plate for laser components; in a first mounting step fixating a plurality of radiation sources on the base plate, at least one of said radiation sources being provided with a telescopic lens arrangement; and in a second mounting step fixating a beam angle correction plate inside said telescopic lens arrangement, the beam angle correction plate being fixated at an angle in relation to the radiation beam path so as to parallel shift the radiation beam inside the telescope and consequently adjust the angle of the radiation beam path outside the telescope.

The fixating of laser components in the first and/or second step may be made using a heat curing adhesive. The fixating of laser components in the first and/or second step may alternatively be made by soldering or any other manufacturing method for securely and permanently mounting the components to the base plate. Preferably, use is made of an adhesive that is both ultraviolet (UV) and heat curing, wherein exposure to UV light is employed in a pre-curing step before the heat curing.

The inventive method of mounting and fixating the beam correction plate(s) in a step subsequent to the mounting of the radiation sources and the associated optics, has the advantage that any movement or misalignment of components that may have occurred during the preceding steps (e.g. during curing) can be compensated. The effect of the beam correction plate(s) on the beam path is comparatively small, meaning that a comparatively large tilt or slant angle of the beam correction plate(s) is required for altering the beam path. Consequently, any inadvertent movement of the beam correction plate itself during the mounting thereof (e.g. during curing of an adhesive used for fixating the beam correction plate) will typically have a negligible effect on the final beam quality.

Generally, all terms used in the claims are to be interpreted according to their ordinary meaning in the technical field, unless explicitly defined otherwise herein. All references to "a/an/the [element, device, component, means, step, etc.]" are to be interpreted openly as referring to at least one instance of the element, device, component, means, step, etc., unless explicitly stated otherwise.

As used herein, "multi-wavelength" and "multi-wavelength laser system" refer to a type of light source in which the outputs from a plurality of radiation sources are combined into an output having multiple wavelength lines.

BRIEF DESCRIPTION OF THE DRAWINGS

The above objects, as well as additional objects, features and advantages of the present invention, will be more fully appreciated by reference to the following illustrative and non-limiting detailed description of preferred embodiments of the present invention, when taken in conjunction with the accompanying drawings, wherein:

FIG. 3 is a block diagram of the method according to the invention.

DETAILED DESCRIPTION OF PREFERRED EMBODIMENTS OF THE INVENTION

Figure 1:
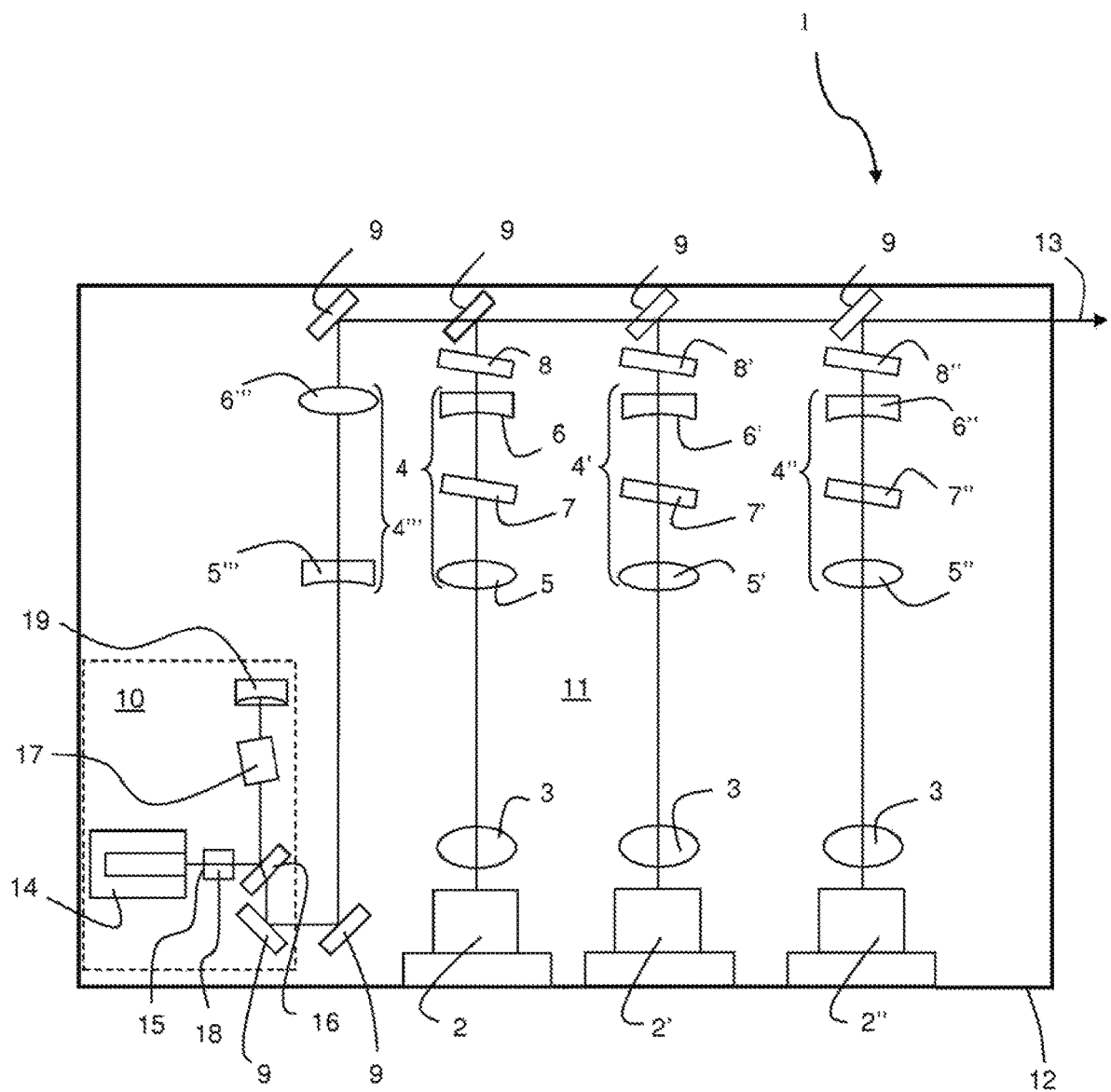
FIG. 1 shows a schematic view of a multi-wavelength laser system according to the invention.

FIG. 1 shows a multi-wavelength laser system 1 comprising four laser modules, namely three diode lasers 2, 2', 2" and one diode-pumped solid state laser 10 mounted on a base plate 11 in a housing 12. Each diode laser 2, 2', 2" is associated with respective beam shaping optics 3 for shaping and collimating the output radiation from the laser diodes 2, 2', 2", and a telescope 4, 4', 4" for beam contraction including a first lens 5 and a second lens 6. In FIG. 1 the first lens 5 of the telescope is a convex lens and the second lens 6 is a concave lens for reducing the radiation beam cross-sectional area. Further, a beam angle correction plate 7, 7', 7" is placed inside each of the telescopes of the three diode lasers 2, 2', 2". The beam angle correction plates 7, 7', 7" are e.g. plane-parallel glass plates for shifting (parallel adjustment) the position of the laser beam inside each telescope, and thereby causing a shift in pointing direction of the beam after passage of the telescope. Optionally, the multi-wavelength laser system further comprises beam adjusting plates 8, 8', 8" positioned outside (in the shown embodiment placed downstream of) the telescopes for parallel adjustment of the position of the laser beams without changing the pointing direction. The adjusting plates 8, 8', 8" are not required in all multi-wavelength systems, especially not in systems that are very compact. The laser beams from the individual laser modules and the combined laser beam 13 built up by the individual laser beams are indicated in FIG. 1 by solid lines ending with an arrowhead at the output from the laser system. The lines show schematically how the laser beam/beams are directed by the optical components mounted on the base plate 11. Wavelength-selective mirrors/beam-splitters 9 are provided in order to direct the individual laser beams into the combined output 13.

The diode-pumped solid state laser 10 comprises a pump laser diode 14, a laser crystal 18 that can be optically pumped by radiation from the laser diode 14, a first cavity end mirror 15 deposited on a face of the laser crystal, a second cavity mirror 19 which is typically curved for resonator stability, a non-linear crystal 17 for frequency conversion placed in the cavity, and a folding mirror 16 for the cavity as well as out-coupler for the generated radiation.

Figure 2:
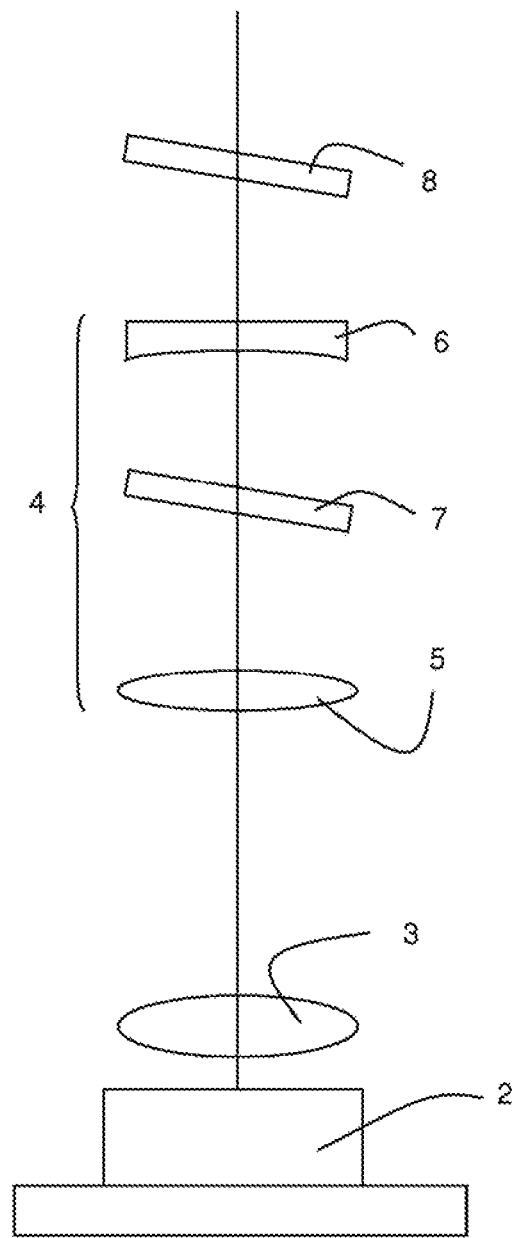
FIG. 2 shows a telescope for aligning at least one laser beam in a multi-wavelength laser system as shown in FIG. 1.

FIG. 2 shows a schematic view of a diode laser 2, beam shaping optics 3, a telescope 4 consisting of a first lens 5 that is convex and a second lens 6 that is concave. A beam angle correction plate 7 made from a piece of glass with parallel surfaces is placed inside the telescope 4 for parallel adjustment of the laser beam position inside the telescope, leading to a shift in pointing direction outside the telescope 4. A similar beam adjusting plate 8 made from a piece of glass with parallel surfaces is placed outside the telescope 4 for parallel adjustment of the laser beam position (without altering the pointing direction thereof). Typically, the lenses as well as the glass plates will have anti-reflection coated surfaces in order to reduce losses. It should also be noted that the beam shaping optics 3 is shown only schematically in the figure; in a typical implementation the beam shaping optics 3 will include a plurality of optical components, such as cylindrical and spherical lenses, prisms/wedges, etc., as generally known in the art.

With reference to FIG. 3, a method for assembling a multi-wavelength laser system will be exemplary explained. In a first step S1, a base plate is provided, preferably placed in an outer casing. The outer casing 12 may be made from Kovar® and may have a bottom surface and side walls made from one piece. The bottom of the outer casing preferably has a thickness of a few millimeters, in order to be sufficiently thin to avoid excess temperature gradients therein when heat is removed from the laser package and into a substructure upon which the laser package is installed. The base plate is preferably made from a material that has similar coefficient of thermal expansion (CTE) as the laser components that are to be mounted on the base plate. In general, it is preferred to have a base plate made from a material having a CTE below 12 ppm/K for temperatures up to about 150° C. (typical curing temperature for adhesives used). For practical reasons, the thermal conductivity of the base plate should preferably be at least 50 W/(m·K). One suitable material for the base plate is AlSiC.

When manufacturing the multi-wavelength laser system of FIG. 1, a base plate 11 is provided, on which the radiation sources 2, 2', 2", 10, as well as the telescopes 4 are mounted (Step S2). Mounting of components on the base plate may in one embodiment be performed using heat curing adhesive. Preferably, the adhesive used is both ultraviolet (UV) and heat curing, in order to allow for a pre-curing using UV light in the manufacturing process, and then full curing in an oven once the various components have been correctly positioned and oriented on the base plate. During assembly, the various components are positioned and oriented using tools that hold the components in place, and when the correct positions and orientations have been obtained, the components are fixed in place by UV curing the adhesive. Once the adhesive has been thus pre-cured using UV light, the tools can be removed, and the assembly comprising the casing, the base plate and the radiation sources is then subjected to a first heat curing step in order to fully cure the adhesive. During this first part of the manufacturing process, the beam correction plates 7, 7', 7" are temporarily included in the setup, but are not fixed in place at this stage. Rather, the beam correction plates are removed before the first heat curing step. The reason for having the beam correction plates temporarily in place at this stage is that the optimal position and orientation of the other components will, at least to some degree, depend on whether there are such beam correction plates present or not. Since the beam correction plates will be permanently mounted in a subsequent step, due account must be taken when positioning and orienting the other components in the first mounting step. During this initial stage, however, the beam correction plates are typically oriented normal (i.e. not angled) to the beam path.

During the first mounting step S2, and particularly during curing of the adhesive, it may happen (and typically will happen) that there is some slight movement of the components, resulting in sub-optimal positioning and/or orientation thereof, which in turn may lead to errors in the pointing directions of the individual beams. Therefore, in a subsequent step S3, the beam angle correction plates 7, 7', 7" are mounted inside one or more of the telescopic lens arrangements. The angle (i.e. pointing direction) of the beam is corrected by adjusting the orientation of the beam angle correction plate in relation to the radiation beam path so as to parallel shift the radiation beam inside the telescope and thereby adjust the angle of the radiation beam path outside the telescope to align it with the combined beam path of the multi-wavelength laser system. When the beam angle correction plates 7, 7', 7" are correctly aligned so that a single collimated beam or a desired beam pattern is obtained from the beams of the individual radiation sources, the beam angle correction plates are fixed in position and orientation. The mounting of the beam correction plates is preferably made in a manner similar to the mounting of the components during the preceding step, i.e. using tools for correctly positioning and orienting the plates, and then exposing the adhesive to UV light in order to lock the position and orientation before a second heat curing step to fully cure the adhesive. Suitably, the same UV and heat curing adhesive is preferably used in both mounting steps S2 and S3.

It should be noted that the mounting of the laser components and/or the beam angle correction plates may alternatively be made by soldering or any other suitable fixation method.

By placing a beam angle correction plate 7, 7', 7" in a telescope, a very simple and robust solution for setting the beam angle (pointing direction) is achieved so as to create a collinear or parallel output from the multi-wavelength laser system and avoid a composite multi-wavelength beam that would diverge into separate beams or a distorted beam pattern after some distance. Since the alignment is made in a manufacturing step where the beam angle correction plates are permanently fixed, the positioning and orientation is permanent and no service of the beam correction plates will ever have to be made, which is a big advantage in many situations. The laser system will be robust and less sensitive to external forces that could potentially alter the position of optics in the prior art systems. The inventive solution also avoids any expensive and sensitive control mechanism for the position and direction of the beams that some of the prior art systems need. Thus, the compactness of the system in combination with the inventive use of beam angle correction plates inside the telescopes make it possible to manufacture a high-precision multi-wavelength laser system free from moving parts, which in turn gives a system that is virtually service-free.

In the exemplary embodiment, with reference to FIG. 1, the outer casing is made from Kovar®. Within the outer casing, there is provided a base plate. The preferred material for the base plate is AlSiC. From a purely thermal management and thermal expansion point of view, however, also other materials could a priori seem attractive for the base plate, such as CuW or Kovar®.

Moreover, in order to provide good shock resistance for the laser package, the base plate is preferably made from a material having a density of less than about 5 $g/cm^3$ and has preferably a thickness in the range 6-15 mm. A particularly suitable material that fulfils the above preferred characteristics is AlSiC.

In step S3 the beam angle correction plates are carefully positioned and aligned to direct all radiation beams from all radiation sources into a desired output, here a collinear output. In step S3 the optional further beam adjusting plates 8, 8', 8" for adjusting the lateral position of the beams may also be mounted and adjusted to align the radiation beams from all radiation sources into one beam where all sub-beams overlap. As explained above, however, in other embodiments the sub-beams may not overlap but rather form a desired output pattern.

The beam angle correction plates 7, 7', 7" are thus mounted in a last step, when all other core optical components have already been mounted. By doing this, any misalignment that may occur during the mounting of the previous components, e.g. during the heat curing, can be corrected by means of the beam angle correction plates. Misalignment of the correction plates themselves will have only a very small impact on the overall alignment of the multi-wavelength laser system. In other words, even a small correction of the beam will require a fairly large tilt angle of the corresponding correction plate, thus making the placement and orientation of the correction plates fairly insensitive to small misalignments that may be introduced during, for example, the curing in step S3.

Hence, by mounting the beam correction plate or plates in a separate subsequent manufacturing step, any misalignment introduced during the previous mounting of other components, such as small movements during curing, can be compensated while at the same time any misalignment of the beam angle correction plate itself will have negligible effect on the quality of the output from the multi-wavelength laser system.

Once all desired components and connections have been provided in the laser package according to the above, the laser package is typically sealed by welding a lid to the upper side of the outer casing side walls.

Although the invention has been described above with reference to drawings and preferred embodiments, it should be understood that various modifications are possible without departing from the spirit and the scope of the invention as defined by the claims. E.g. in the embodiment above a multi-wavelength laser system has been described having an output with overlapping beams. It should however, be noted that the beam angle correction by means of the beam angle correction plate placed inside the telescope of the radiation sources also may be used in multi-laser systems producing an output of light sheets, an array of spots or other multi-laser systems with aligned output.

The invention claimed is:

1. A multi-wavelength laser module comprising
   a base plate,
   a plurality of individual laser sources mounted on said base plate, each individual laser source configured to emit a laser beam having a wavelength of light that is different from that emitted from at least one of the other individual laser sources,
   at least two of said individual laser sources each including:
      a respective telescope comprising a respective first lens and a respective second lens, wherein for each telescope one of said first and said second lens is convex and the other of said first lens and said second lens is concave, wherein said second lens is arranged at a distance from said first lens along a radiation beam path of each of said at least two of said individual laser sources, and
      a respective beam angle correction plate arranged between said first lens and said second lens of said respective telescope in said radiation beam path of each of said at least two of said individual laser sources, said beam angle correction plate being configured to introduce a parallel shift of the laser beam while maintaining pointing direction between the first and second lens of the respective telescope, resulting in a shift in pointing direction for the laser beam from the corresponding individual laser source after passage of the respective telescope, wherein each respective telescope is configured to receive only the beam from the corresponding individual laser source, the laser module further comprising a plurality of wavelength-selective mirrors configured to align the individual laser beams into a combined output beam.

2. The multi-wavelength laser module according to claim 1, wherein said base plate has a footprint smaller than about 25×25 cm$^2$.

3. The multi-wavelength laser module according to claim 1, wherein said beam angle correction plate is a plane-parallel plate.

4. The multi-wavelength laser module according to claim 1, wherein said beam angle correction plate has an anti-reflection coating on at least one of its surfaces.

5. The multi-wavelength laser module according to claim 1, further comprising at least one beam adjusting plate arranged outside of said at least one telescope, said beam adjusting plate being angled in relation to the beam path in order to introduce a parallel adjustment of the position of the beam path.

6. The multi-wavelength laser module according to claim 5, wherein said beam adjusting plate is a plane-parallel plate.

7. The multi-wavelength laser module according to claim 1, wherein said individual laser sources are selected from the group: diode lasers, diode-pumped solid state lasers, and solid state lasers.

8. The multi-wavelength laser module according to claim 1, wherein the plurality of individual laser sources includes at least three individual laser sources, wherein a respective telescope is provided for all but one of the plurality of individual laser sources.

9. The multi-wavelength laser module according to claim 1, wherein the plurality of individual laser sources includes at least three individual laser sources, wherein a beam angle correction plate is provided for all but one of the plurality of individual laser sources.

10. A method for assembling a multi-wavelength laser system comprising the steps of:
providing a base plate for laser components,
in a first mounting step, fixating a plurality of individual laser sources on said base plate, each individual laser source configured to emit a laser beam having a wavelength of light that is different from that emitted from at least one of the other individual laser sources, at least two of said individual laser sources each including a respective telescope comprising a telescopic lens arrangement that comprises a first and a second lens, wherein one of said first and said second lens is convex and the other of said first lens and said second lens is concave, wherein the second lens is arranged at a distance from the first lens along a radiation path of each of said at least two of said individual laser sources,
in a second mounting step subsequent to said first mounting step, fixating a respective beam angle correction plate inside each of at least two of the respective telescopic lens arrangement, said beam angle correction plate being fixated at an angle in relation to said radiation beam path of each of said at least two individual laser sources so as to parallel shift said laser beam while maintaining pointing direction inside the telescope and thereby adjust pointing direction of said laser beam outside said telescope, wherein each respective telescope is configured to receive only the beam from the corresponding individual laser source, further comprising, in said first step, fixating a plurality of wavelength-selective mirrors configured to direct the individual laser beams into a combined output beam.

11. The method of claim 10, wherein said fixating in said first and/or second step is made using a heat curing adhesive.

12. The method of claim 10, wherein said fixating in said first and/or second step is made by soldering.

13. The method of claim 10, wherein said fixating is made using an adhesive that is both ultraviolet, UV, and heat curing, and wherein the adhesive is pre-cured using UV light before being heat cured.

14. The method of claim 10, further comprising mounting at least one beam adjusting plate arranged outside of said at least one telescope, said beam adjusting plate being angled in relation to the beam path in order to introduce a parallel adjustment of the position of the beam path.

15. The method of claim 14, wherein said at least one beam adjusting plate is mounted during the second mounting step.

16. A multi-wavelength laser module comprising
a base plate,
a plurality of individual laser sources mounted on said base plate, each individual laser source configured to emit a laser beam having a wavelength of light that is different from that emitted from at least one of the other individual laser sources,
wherein each of said plurality of individual laser sources includes:
a respective telescope comprising a respective first lens and a respective second lens, wherein one of said first and said second lens is convex and the other of said first lens and said second lens is concave, wherein said second lens is arranged at a distance from said first lens along a radiation beam path of each of said at least two of said plurality of individual laser sources, and
a beam angle correction plate arranged in said beam path between said first lens and said second lens of each telescope in said radiation beam path, said beam angle correction plate being configured to introduce a parallel shift of the laser beam while maintaining pointing direction between the first and second lens of the telescope, resulting in a shift in pointing direction for the laser beam from the corresponding individual laser source after passage of the telescope, wherein each respective telescope is configured to receive only the beam from the corresponding individual laser source, the laser module further comprising a plurality of wavelength-selective mirrors configured to align the individual laser beams into a combined output beam.

* * * * *